United States Patent
Jiang

(10) Patent No.: US 9,268,169 B2
(45) Date of Patent: Feb. 23, 2016

(54) DISPLAY PANEL WITH PIXEL DEFINE LAYER, MANUFACTURING METHOD OF PIXEL DEFINE LAYER OF DISPLAY PANEL, AND DISPLAY DEVICE

(71) Applicant: BOE TECHNOLOGY GROUP CO., LTD., Beijing (CN)

(72) Inventor: Chunsheng Jiang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 32 days.

(21) Appl. No.: 14/077,684

(22) Filed: Nov. 12, 2013

(65) Prior Publication Data

US 2014/0131310 A1 May 15, 2014

(30) Foreign Application Priority Data

Nov. 13, 2012 (CN) .......................... 2012 1 0455340

(51) Int. Cl.
*G03F 7/20* (2006.01)
*G02F 1/1335* (2006.01)
*G03F 7/00* (2006.01)
*H05B 33/10* (2006.01)

(52) U.S. Cl.
CPC ........ *G02F 1/133516* (2013.01); *G03F 7/0007* (2013.01); *H05B 33/10* (2013.01)

(58) Field of Classification Search
CPC ..... G03F 7/0005; G03F 7/0007; H05B 33/10; G02F 1/133516
USPC ......... 430/7, 321; 445/24; 313/504, 505, 506, 313/509
See application file for complete search history.

(56) References Cited

U.S. PATENT DOCUMENTS 6,060,728 A * 5/2000 Ghosh et al. ................... 257/93
2014/0203303 A1 7/2014 Jiang

FOREIGN PATENT DOCUMENTS

| CN | 102705790 A | | 10/2012 |
| GB | 2 458 454 A | * | 9/2009 |
| KR | 10-0783814 | | 12/2007 |

OTHER PUBLICATIONS

First Office Action issued by the Chinese Patent Office for Chinese Patent Application No. 201210455340.4 dated Sep. 3, 2014, 7pgs.
English translation of First Office Action issued by the Chinese Patent Office for Chinese Patent Application No. 201210455340.4 dated Sep. 3, 2014, 8pgs.

(Continued)

*Primary Examiner* — John A McPherson
(74) *Attorney, Agent, or Firm* — Ladas & Parry LLP

(57) ABSTRACT

Embodiments of the invention provide a display panel with a pixel define layer, a manufacturing method of a pixel define layer of a display panel, and a display device. The display panel with the pixel define layer comprises: a substrate and the pixel define layer disposed on the substrate. The pixel define layer includes a photosensitive resin layer and a transparent define layer sequentially disposed on the substrate. The photosensitive resin layer has an opening in a region corresponding to each pixel region of the display panel, the transparent define layer has an opening in the region corresponding to each pixel region of the display panel, and the opening of the transparent define layer is smaller than the opening of the photosensitive resin layer so as to form a fill region with a wide lower portion and a narrow upper portion.

14 Claims, 3 Drawing Sheets

(56) References Cited

OTHER PUBLICATIONS

Rejection Decision for Chinese Patent Application No. 201210455340.4 dated Jan. 27, 2015; five (5) pages.
English translation of Rejection Decision for Chinese Patent Application No. 201210455340.4 dated Jan. 27, 2015; nine (9) pages.
Second Office Action issued by State Intellectual Property Office of P.R.C., in Chinese Patent Application No. 201210455340.4, dated Nov. 19, 2014; five (5) pages.
English translation of Second Office Action issued by State Intellectual Property Office of P.R.C., in Chinese Patent Application No. 201210455340.4, dated Nov. 19, 2014; seven (7) pages.

* cited by examiner

DISPLAY PANEL WITH PIXEL DEFINE LAYER, MANUFACTURING METHOD OF PIXEL DEFINE LAYER OF DISPLAY PANEL, AND DISPLAY DEVICE

CROSS REFERENCE TO RELATED APPLICATIONS

This application claims priority from Chinese National Application No. 201210455340.4 filed on Nov. 13, 2012, the contents of which are incorporated herein by reference.

TECHNICAL FIELD

Embodiments of the invention relate to a display panel with a pixel define layer, a manufacturing method of the pixel define layer of the display panel, and a display device.

BACKGROUND

Organic Light Emitting Diode (OLED) display panel comprises a substrate, and an anode, a light-emitting layer and a cathode formed on the substrate. The light-emitting layer is generally produced by a printing method so that liquid light-emitting material covers a pixel region of the OLED display panel. The size of the pixel region of the existing high-resolution display panel is generally 30 μm×180 μm, but the diameter of the droplet formed by the printing method is greater than 30 μm. Moreover, the droplet may deviate from its target region at the time of printing. Therefore, the droplet formed by the printing method may flow to adjacent pixel regions, thereby causing defects such as cross-color, Mura, etc.

The Liquid Crystal Display (LCD) panel comprises an array substrate, an opposed substrate, and a liquid crystal layer sandwiched between the array substrate and the opposed substrate. In order to realize color display, the LCD panel further comprises a color filter layer, which may be disposed on the array substrate or the opposed substrate. The color filter layer may be produced by a printing method so that liquid material of color filter layer covers a pixel region of the LCD panel. At this time, there exists also the problem that the droplet formed by the printing method may flow to adjacent pixel regions, thereby causing defects such as cross-color, Mura, etc.

In order to ensure that the droplet formed by the printing method can cover the pixel region evenly and smoothly, and to prevent the droplet from flowing into adjacent pixel regions, the following method is adopted. A photo resist (PR) resin is used to form the photo define layer(PDL), a fluorination treatment is performed on the surface of the PR resin with CF4 of 60% in CVD environment or the PR resin is irradiated with short-wavelength ultraviolet so that the surface energy of the PR resin is changed. Accordingly, the wetting property of the surface of the pixel define layer can be changed and the droplet can flow into the target pixel region even though it deviates from the target pixel region at the time of printing. However, this method needs to increase investment in apparatus and has a high cost, and this method is unfavorable for mass production.

SUMMARY

According to one aspect of the invention, there is provided a display panel with a pixel define layer. The display panel with the pixel define layer comprises: a substrate and the pixel define layer disposed on the substrate. The pixel define layer includes a photosensitive resin layer and a transparent define layer sequentially disposed on the substrate. The photosensitive resin layer has an opening in a region corresponding to each pixel region of the display panel, the transparent define layer has an opening in the region corresponding to each pixel region of the display panel, and the opening of the transparent define layer is smaller than the opening of the photosensitive resin layer so as to form a fill region with a wide lower portion and a narrow upper portion.

For example, the display panel is an OLED display panel, and a light-emitting material is filled into the fill region by a printing method to form a patterned light-emitting layer.

For example, the display panel is a LCD panel, and a color filter material is filled into the fill region by a printing method to form a patterned color filter layer.

For example, the substrate is an array substrate or an opposed substrate of the LCD panel.

For example, the transparent define layer is made of a hydrophobic material.

For example, the transparent define layer is made of silicon nitride.

For example, the transparent define layer is made of a hydrophilic material.

For example, the transparent define layer is made of silicon oxide.

According to another aspect of the invention, there is provided a display device. The display device comprises the above-described display panel with the pixel define layer.

According to yet another aspect of the invention, there is provided a manufacturing method of a pixel define layer of a display panel. The method comprises: step 1: sequentially forming a photosensitive resin layer and a transparent define layer on a substrate; step 2: forming an opening of the photosensitive resin layer and an opening of the transparent define layer in a region corresponding to each pixel region of the display panel, wherein the opening of the transparent define layer is smaller than the opening of the photosensitive resin layer so as to form a fill region with a wide lower portion and a narrow upper portion.

For example, the step 2 includes:
  forming a second photosensitive resin layer on the transparent define layer, and performing a first exposure so that both the second photosensitive resin layer and the photosensitive resin layer under the second photosensitive resin layer in the region corresponding to each pixel region of the display panel are exposed;
  removing the second photosensitive resin layer;
  forming a third photosensitive resin layer, and performing a second exposure so that the third photosensitive resin layer in the region corresponding to each pixel region of the display panel is exposed, wherein an exposure region formed by the second exposure is smaller than an exposure region formed by the first exposure;
  removing the third photosensitive resin layer in the exposure region formed by the second exposure, so as to expose the transparent define layer in this region;
  removing the exposed transparent define layer, so as to form an opening of the transparent define layer in the region corresponding to each pixel region of the display panel; and
  removing the photosensitive resin layer in the exposure region formed by the first exposure, so as to form an opening of the photosensitive resin layer in the region corresponding to each pixel region of the display panel.

For example, the step 2 includes:
  forming a second photosensitive resin layer on the transparent define layer, and performing a first exposure so that both the second photosensitive resin layer and the photosensitive resin layer under the second photosensitive resin layer in the region corresponding to each pixel region of the display panel are exposed;

removing the second photosensitive resin layer, and at the same time, removing the photosensitive resin layer in an exposure region formed by the first exposure, so as to form an opening of the photosensitive resin layer in the region corresponding to each pixel region of the display panel;

forming a third photosensitive resin layer, and performing a second exposure so that the third photosensitive resin layer in the region corresponding to each pixel region of the display panel is exposed, wherein an exposure region formed by the second exposure is smaller than the exposure region formed by the first exposure;

removing the third photosensitive resin layer in the exposure region formed by the second exposure, so as to expose the transparent define layer in this region;

removing the exposed transparent define layer, so as to form an opening of the transparent define layer in the region corresponding to each pixel region of the display panel.

For example, the exposure region formed by the second exposure is smaller than the exposure region formed by the first exposure refers to that: a center of the exposure region formed by the second exposure coincide with a center of the exposure region formed by the first exposure; a shape of the exposure region formed by the second exposure is same as a shape of the exposure region formed by the first exposure; and an area of the exposure region formed by the second exposure is smaller than an area of the exposure region formed by the first exposure.

For example, the first exposure and the second exposure use a same mask plate, and a distance between the mask plate and the substrate in the first exposure is smaller than the distance between the mask plate and the substrate in the second exposure.

For example, the transparent define layer is made of a hydrophobic material.

For example, the transparent define layer is made of silicon nitride.

For example, the transparent define layer is made of a hydrophilic material.

For example, the transparent define layer is made of silicon oxide.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiment One

Figure 1:
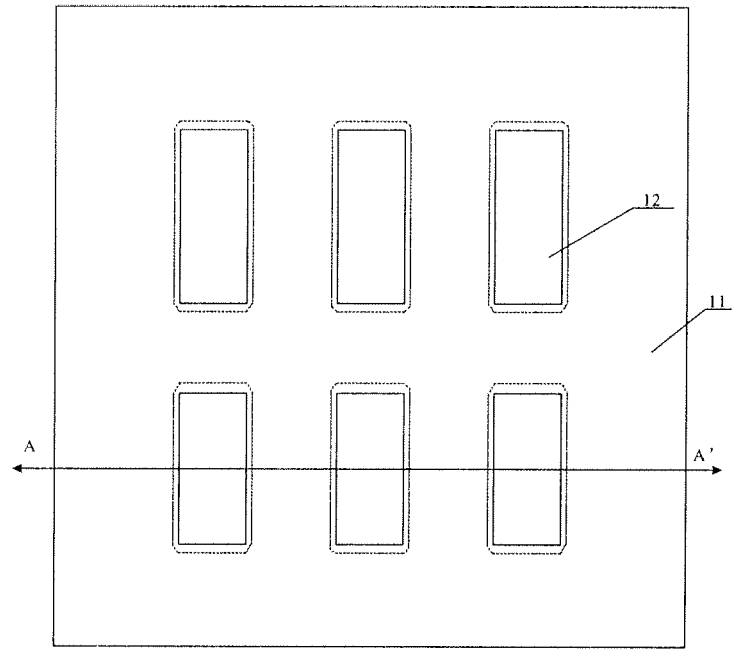
FIG. 1 is a top view of a display panel with a pixel define layer according to Embodiment One of the invention.
Figure 2:
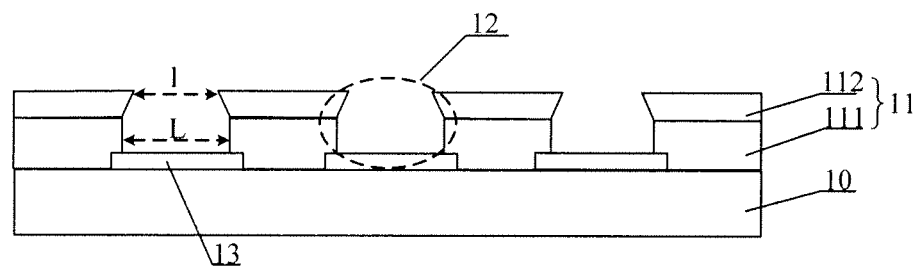
FIG. 2 is a sectional view taken along A-A' direction of FIG. 1.

This embodiment provides a display panel with a pixel define layer. FIG. 1 is a top view of the display panel with the pixel define layer according to the embodiment, and FIG. 2 is a sectional view taken along A-A' direction of FIG. 1. As shown in FIG. 1, the display panel comprises: a substrate 10 and a pixel define layer 11 disposed on the substrate 10. The pixel define layer 11 includes: a photosensitive resin layer 111 and a transparent define layer 112 sequentially disposed on the substrate 10. The photosensitive resin layer 111 has an opening in a region corresponding to each pixel region of the display panel, the transparent define layer 112 has an opening in the region corresponding to each pixel region of the display panel, and the opening of the transparent define layer 112 is smaller than the opening of the photosensitive resin layer 111 so as to form a fill region 12 with a wide lower portion and a narrow upper portion.

In the manufacture process of the display panel, a desired liquid material is filled into the fill region 12 by a printing method so that a patterned film is formed.

For example, the above display panel is an OLED display panel, and a liquid light-emitting material is filled into the fill region 12 by a printing method to form a patterned light-emitting layer. When the display panel is the OLED display panel, the substrate 10 may be further provided with a thin-film transistor (not shown), an anode 13 (as shown in FIG. 2) and a cathode (not shown).

For example, the above display panel is a LCD panel, and a liquid color filter material is filled into the fill region 12 by a printing method to form a patterned color filter layer. At this time, the substrate 10 may be an array substrate or an opposed substrate of the LCD panel.

When the liquid material to be filled into the fill region 12 is hydrophilic, preferably the transparent define layer 112 is made of a hydrophobic material, such as, silicon nitride ($SiN_x$, where x ranges from 1 to 4/3). When the liquid material to be filled into the fill region 12 is hydrophobic, preferably the transparent define layer 112 is made of a hydrophilic material, such as, silicon oxide ($SiO_x$, where x ranges from 1 to 2). In this way, the droplet formed by the printing method can flow into the fill region 12 even though it deviates from the target pixel region at the time of printing, and at the same time, it is not needed to perform a surface treatment on the pixel define layer 11 and to increase the investment in apparatus. Thereby, the cost can be reduced and the mass production can be realized.

For example, the photosensitive resin layer 111 has a thickness of 800~1000 nm, and the transparent define layer 112 has a thickness of 200~300 nm.

In this embodiment, the pixel define layer 11 includes the photosensitive resin layer 111 and the transparent define layer 112 sequentially formed on the substrate 10, the photosensitive resin layer 112 has the opening in the region corresponding to each pixel region of the display panel, the transparent define layer 111 has the opening in the region corresponding to each pixel region of the display panel, and the opening of the transparent define layer 112 is smaller than the opening of the photosensitive resin layer 111 so as to form the fill region 12 with the wide lower portion and the narrow upper portion. Therefore, when the desired liquid material is filled into the fill region 12 by a printing method, it can ensure that the droplet formed by the printing method can fill the fill region of the pixel define layer evenly and smoothly. Thus, the droplet can be prevented from flowing into adjacent pixel regions, defects of the display panel, such as cross color, Mura and the like, can be avoided and the display quality of the display panel can be improved. In addition, as described in a second embodiment of the invention hereinafter, the above pixel define layer 11 can be formed by one mask plate, thus the number of the masks to be used can be reduced and the manufacture cost can be reduced.

The embodiment of the invention further provides a display device comprising the above display panel with the pixel define layer. In the display device, the display quality can be improved, and cross-color, Mura and other defects can be avoided. In addition, the manufacture process of the display panel can be simplified, the cost can be reduced and the mass production can be realized.

The display device may be any product or component having a display function, such as OLED display device, LCD device, e-paper, mobile phone, pad, TV, monitor, notebook computer, digital photo frame, navigator and the like.

Embodiment Two

This embodiment provides a manufacturing method of a pixel define layer of a display panel. The method comprises the following steps.

Figure 3:
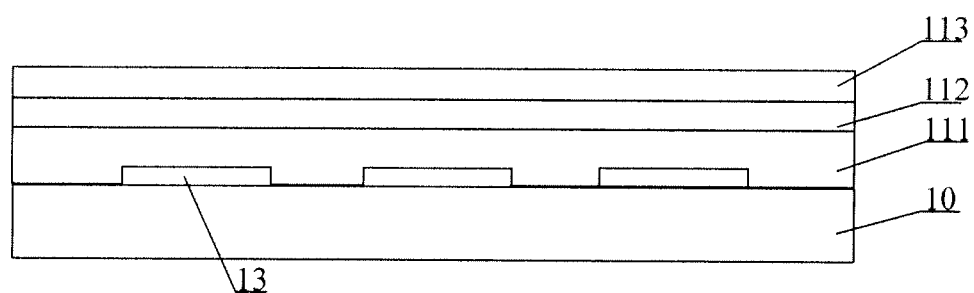
FIG. 3 is a schematic diagram illustrating forming a photosensitive resin layer and a transparent define layer in a manufacturing method of a pixel define layer of a display panel according to Embodiment Two of the invention.

Step 201: sequentially forming a photosensitive resin layer 111 and a transparent define layer 112 on a substrate 10, as shown in FIG. 3.

In this step, the photosensitive resin layer 111 and the transparent define layer 112 are formed on the substrate 10 sequentially. The method for forming the photosensitive resin layer 111 and the transparent define layer 112 may be a physical vapor deposition (PVD) method such as evaporation, sputtering, ion plating and the like, or may be a chemical vapor deposition (CVD) method. The method for forming the photosensitive resin layer 111 and the transparent define layer 112 may be selected in accordance with the materials for forming them, and shall not be limited in the embodiment.

The transparent define layer 112 may be made of a hydrophobic material, such as, silicon nitride ($SiN_x$, where x ranges from 1 to 4/3). Alternatively, the transparent define layer 112 may be made of a hydrophilic material, such as, silicon oxide ($SiO_x$, where x ranges from 1 to 2).

For example, the transparent define layer 112 is formed of silicon nitride, and in this case, the step may be performed in the following manner.

Firstly, the photosensitive resin layer 111 with a thickness of about 800 nm~1000 nm is spin-coated on the substrate 10.

Then, on the photosensitive resin layer 111, a $SiN_x$ film with a thickness of about 200 nm~300 nm is deposited as the transparent define layer 112 by using plasma enhanced chemical vapor deposition (PECVD) or RF cold plasma at atmospheric-pressure.

Figure 4:
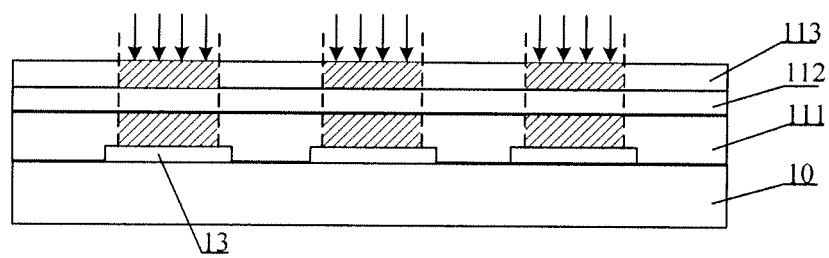
FIG. 4 is a schematic diagram illustrating a first exposure in the manufacturing method of the pixel define layer of the display panel according to Embodiment Two of the invention.

Step 202: forming a second photosensitive resin layer 113, and performing a first exposure so that both the second photosensitive resin layer 113 and the photosensitive resin layer 111 under the second photosensitive resin layer 113 in a region corresponding to each pixel region of the display panel are exposed, as shown in FIG. 4.

In this step, a photosensitive resin material is spin-coated on the transparent define layer 112 (e.g., made of $SiN_x$) to form the second photosensitive resin layer 113. As the transparent define layer 112 (e.g., made of $SiN_x$) is transparent, both the second photosensitive resin layer 113 and the photosensitive resin layer 111 under the second photosensitive resin layer 113 in the region corresponding to each pixel region of the display panel are exposed. The shadow region shown in FIG. 4 is an exposed region.

Figure 5:
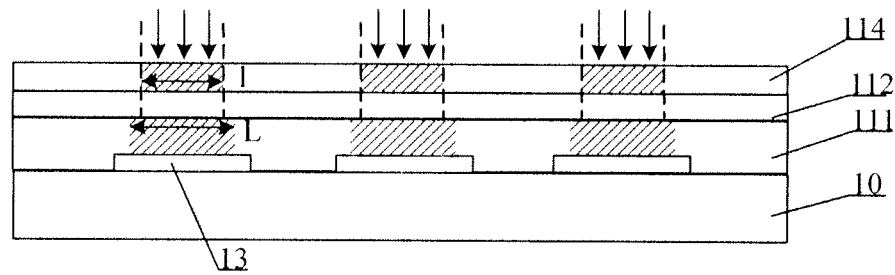
FIG. 5 is a schematic diagram illustrating a second exposure in the manufacturing method of the pixel define layer of the display panel according to Embodiment Two of the invention.

Step 203: removing the second photosensitive resin layer 113, forming a third photosensitive resin layer 114, and performing a second exposure so that the third photosensitive resin layer 114 in the region corresponding to each pixel region of the display panel is exposed, wherein an exposure region formed by the second exposure is smaller than an exposure region formed by the first exposure, as shown in FIG. 5.

In this step, the second photosensitive resin layer 113 may be removed with a stripper, or it may be removed in any other suitable manners. Then, a photosensitive resin material is spin-coated to form the third photosensitive resin layer 114. A second exposure is performed on the third photosensitive resin layer 114, and the exposure region formed by the second exposure is smaller than the exposure region formed by the first exposure.

The exposure region formed by the second exposure being smaller than the exposure region formed by the first exposure in this step refers to: a center of the exposure region formed by the second exposure coincide with a center of the exposure region formed by the first exposure; a shape of the exposure region formed by the second exposure is same as a shape of the exposure region formed by the first exposure; and an area of the exposure region formed by the second exposure is smaller than an area of the exposure region formed by the first exposure.

It should be noted that, a mask plate used in the first exposure can further be used in the second exposure, and the smaller exposure region can be formed only by increasing a distance between the mask plate and the substrate 10 in the second exposure.

Figure 6:
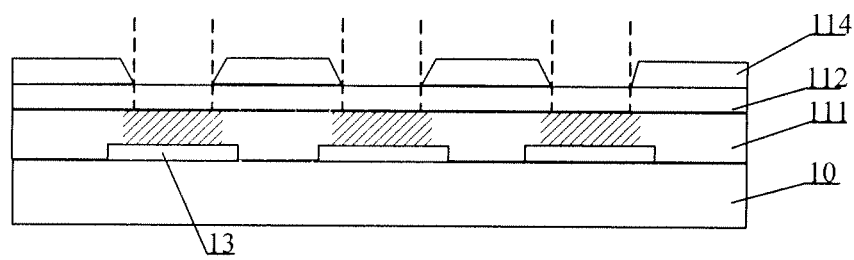
FIG. 6 is a schematic diagram illustrating developing a third photosensitive resin layer in the manufacturing method of the pixel define layer of the display panel according to Embodiment Two of the invention.

Step 204: removing the third photosensitive resin layer 114 in the exposure region formed by the second exposure, so as to expose the transparent define layer 112 in this region, as shown in FIG. 6.

For example, the third photosensitive resin layer 114 in the exposure region formed by the second exposure is removed by using a developer. In addition, the third photosensitive resin layer 114 in the exposure region formed by the second exposure may be removed in any other suitable manners.

Figure 7:
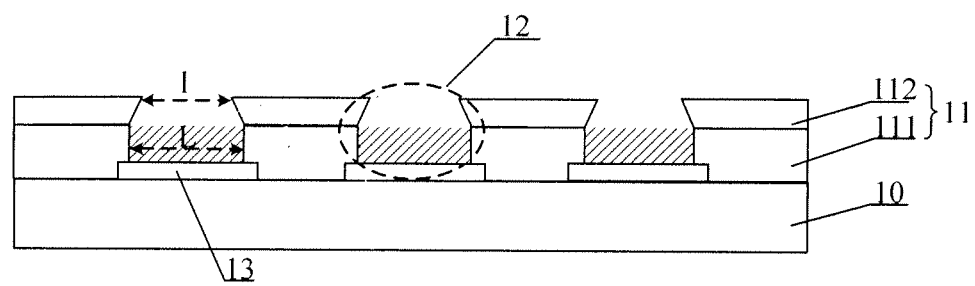
FIG. 7 is a schematic diagram illustrating etching the transparent define layer in the manufacturing method of the pixel define layer of the display panel according to Embodiment Two of the invention.

Step 205: removing the exposed transparent define layer 112, so as to form an opening 1 of the transparent define layer 112 in the region corresponding to each pixel region of the display panel, as shown in FIG. 7.

In this step, for example, an etching process is performed to form the opening 1 of the transparent define layer 112 in the region corresponding to each pixel region of the display panel. The etching method for the etching process may be selected in accordance with the material of the transparent define layer 112. Due to the protection and limitation from the third photosensitive resin layer 114, the opening 1 formed in the transparent define layer 112 is smaller than an opening L formed in the photosensitive resin layer 111.

When the transparent define layer 112 is made of silicon nitride, preferably, the exposed silicon nitride film (the transparent define layer 112) is etched by a dry-etching method. The dry-etching method includes, but not limited to, sputtering and ion beam milling etching, reactive ion etching (RIE), high density plasma etching, and high pressure plasma etching. Preferably, the RIE is adopted, and $CF_4$ and $O_2$ are taken as reaction gases. The RIE can cause an undercutting of the silicon nitride film (the undercutting refers to the phenomenon that the etching also occurs in other directions with respect to the etching direction when a film such as $SiN_x$ film is etched), so that the $SiN_x$ film (the transparent define layer 112) presents the structure shown in FIG. 7. As shown in FIG. 7, the opening 1 of the transparent define layer 112 has a narrow upper portion and a wide lower portion, Finally, for example, the remaining third photosensitive resin layer 114 is removed using a stripper. In addition, the remaining third photosensitive resin layer 114 may be removed in any other suitable manners.

Furthermore, the manufacturing method of the pixel define layer of the display panel further comprises:

Step 206: removing the photosensitive resin layer 111 in the exposure region formed by the first exposure, so as to form an opening L of the photosensitive resin layer 111 in the region corresponding to each pixel region of the display panel.

For example, the photosensitive resin layer 111 in the exposure region formed by the first exposure is removed by using a developer.

Alternatively, the photosensitive resin layer 111 in the exposure region formed by the first exposure may be removed when the second photosensitive resin layer 113 is removed in step 203.

As the exposure region formed by the second exposure is smaller than the exposure region formed by the first exposure, the opening formed in the photosensitive rein layer 111 is larger than the opening formed in the transparent define layer 112 so that the fill region 12 with the wide lower portion and the narrow upper portion is formed. Therefore, when the desired liquid material is filled into the fill region 12 by a printing method, it can ensure that the droplet formed by the printing method can fill the fill region of the pixel define layer evenly and smoothly. Thus, the droplet can be prevented from flowing into adjacent pixel regions, defects of the display panel, such as cross color, Mura and the like, can be avoided and the display quality of the display panel can be improved. In addition, as described in the second embodiment of the invention, the pixel define layer 11 can be formed by one mask plate, thus the number of the masks to be used can be reduced and the manufacture cost can be reduced.

After the pixel define layer 11 is formed, the desired liquid material is filled into the fill region 12 by a printing method, so as to form a patterned film.

For example, the above display panel is an OLED display panel, and a liquid light-emitting material is filled into the fill region 12 by a printing method to form a patterned light-emitting layer. When the display panel is the OLED display panel, the substrate 10 may be further provided with a thin-film transistor (not shown), an anode 13 (as shown in FIG. 2) and a cathode (not shown).

For example, the above display panel is a LCD panel, and a liquid color filter material is filled into the fill region 12 by a printing method to form a patterned color filter layer. At this time, the substrate 10 may be an array substrate or an opposed substrate of the LCD panel.

It should be noted that although the above embodiments of the invention has described that the liquid light-emitting material is filled into the fill region 12 to form the patterned light-emitting layer or the liquid color filter material is filled into the fill region to form the patterned color filter layer, the embodiments of the invention are not limited thereto. The embodiments of the invention can be widely applied in the cases that the patterned films are formed by a printing method, which shall not be enumerated one by one.

The foregoing embodiments merely are exemplary embodiments of the invention, and not intended to define the scope of the invention, and the scope of the invention is determined by the appended claims.

What is claimed is:

1. A manufacturing method of a pixel define layer of a display panel, comprising:
   step 1: sequentially forming a photosensitive resin layer and a transparent define layer on a substrate;
   step 2: forming an opening of the photosensitive resin layer and an opening of the transparent define layer in a region corresponding to each pixel region of the display panel,
   wherein the opening of the transparent define layer is smaller than the opening of the photosensitive resin layer so as to form a fill region with a wide lower portion and a narrow upper portion,
   wherein the step 2 includes:
   forming a second photosensitive resin layer on the transparent define layer, and performing a first exposure so that both the second photosensitive resin layer and the photosensitive resin layer under the second photosensitive resin layer in the region corresponding to each pixel region of the display panel are exposed;
   removing the second photosensitive resin layer;
   forming a third photosensitive resin layer, and performing a second exposure so that the third photosensitive resin layer in the region corresponding to each pixel region of the display panel is exposed, wherein an exposure region formed by the second exposure is smaller than an exposure region formed by the first exposure;
   removing the third photosensitive resin layer in the exposure region formed by the second exposure, so as to expose the transparent define layer in this region;
   removing the exposed transparent define layer, so as to form an opening of the transparent define layer in the region corresponding to each pixel region of the display panel; and
   removing the photosensitive resin layer in the exposure region formed by the first exposure, so as to form an opening of the photosensitive resin layer in the region corresponding to each pixel region of the display panel.

2. The method according to claim 1, wherein the exposure region formed by the second exposure is smaller than the exposure region formed by the first exposure refers to that:
   a center of the exposure region formed by the second exposure coincide with a center of the exposure region formed by the first exposure;
   a shape of the exposure region formed by the second exposure is the same as a shape of the exposure region formed by the first exposure; and
   an area of the exposure region formed by the second exposure is smaller than an area of the exposure region formed by the first exposure.

3. The method according to claim 1, wherein the first exposure and the second exposure use a same mask plate, and a distance between the mask plate and the substrate in the first exposure is smaller than the distance between the mask plate and the substrate in the second exposure.

4. The method according to claim 1, wherein the transparent define layer is made of a hydrophobic material.

5. The method according to claim 4, wherein the transparent define layer is made of silicon nitride.

6. The method according to claim 1, wherein the transparent define layer is made of a hydrophilic material.

7. The method according to claim 6, wherein the transparent define layer is made of silicon oxide.

8. A manufacturing method of a pixel define layer of a display panel, comprising:
   step 1: sequentially forming a photosensitive resin layer and a transparent define layer on a substrate;
   step 2: forming an opening of the photosensitive resin layer and an opening of the transparent define layer in a region corresponding to each pixel region of the display panel, wherein the opening of the transparent define layer is smaller than the opening of the photosensitive resin layer so as to form a fill region with a wide lower portion and a narrow upper portion,
   wherein the step 2 includes:
   forming a second photosensitive resin layer on the transparent define layer, and performing a first exposure so that both the second photosensitive resin layer and the photosensitive resin layer under the second photosensitive resin layer in the region corresponding to each pixel region of the display panel are exposed;
   removing the second photosensitive resin layer, and at the same time, removing the photosensitive resin layer in an exposure region formed by the first exposure, so as to form an opening of the photosensitive resin layer in the region corresponding to each pixel region of the display panel;
   forming a third photosensitive resin layer, and performing a second exposure so that the third photosensitive resin layer in the region corresponding to each pixel region of the display panel is exposed, wherein an exposure region formed by the second exposure is smaller than the exposure region formed by the first exposure;
   removing the third photosensitive resin layer in the exposure region formed by the second exposure, so as to expose the transparent define layer in this region;
   removing the exposed transparent define layer, so as to form an opening of the transparent define layer in the region corresponding to each pixel region of the display panel.

9. The method according to claim 8, wherein the exposure region formed by the second exposure is smaller than the exposure region formed by the first exposure refers to that:
   a center of the exposure region formed by the second exposure coincide with a center of the exposure region formed by the first exposure; a shape of the exposure region formed by the second exposure is the same as a shape of the exposure region formed by the first exposure; and an area of the exposure region formed by the second exposure is smaller than an area of the exposure region formed by the first exposure.

10. The method according to claim 8, wherein the first exposure and the second exposure use a same mask plate, and a distance between the mask plate and the substrate in the first exposure is smaller than the distance between the mask plate and the substrate in the second exposure.

11. The method according to claim 8, wherein the transparent define layer is made of a hydrophobic material.

12. The method according to claim 11, wherein the transparent define layer is made of silicon nitride.

13. The method according to claim 8, wherein the transparent define layer is made of a hydrophilic material.

14. The method according to claim 13, wherein the transparent define layer is made of silicon oxide.

* * * * *